US012686915B2

(12) United States Patent
Fukazawa et al.

(10) Patent No.: US 12,686,915 B2
(45) Date of Patent: Jul. 21, 2026

(54) SUBSTRATE PROCESSING METHOD

(71) Applicant: Tokyo Electron Limited, Tokyo (JP)

(72) Inventors: Atsuki Fukazawa, Tokyo (JP); Hiroki Maehara, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 164 days.

(21) Appl. No.: 18/413,074

(22) Filed: Jan. 16, 2024

(65) Prior Publication Data

US 2024/0150890 A1 May 9, 2024

Related U.S. Application Data

(63) Continuation of application No. PCT/JP2022/027637, filed on Jul. 14, 2022.

(30) Foreign Application Priority Data

Jul. 28, 2021 (JP) ................................. 2021-123465

(51) Int. Cl.
*C23C 16/04* (2006.01)
*C23C 16/06* (2006.01)
(Continued)

(52) U.S. Cl.
CPC .......... *C23C 16/045* (2013.01); *C23C 16/042* (2013.01); *C23C 16/06* (2013.01);
(Continued)

(58) Field of Classification Search
None
See application file for complete search history.

(56) References Cited

U.S. PATENT DOCUMENTS

| | | | |
|---|---|---|---|
| 7,749,905 B2 | 7/2010 | Cohen et al. | |
| 9,305,795 B2 * | 4/2016 | Kamada | H10D 64/017 |

(Continued)

FOREIGN PATENT DOCUMENTS

| | | |
|---|---|---|
| JP | 2014-011165 A | 1/2014 |
| JP | 2020-017708 A | 1/2020 |
| KR | 20150027715 A | 3/2015 |

OTHER PUBLICATIONS

Takei "Integration of out of plane silicon dioxide microtubes, silicon microprobes and on-chip NMOSFETs by selective vapor-liquid-solid growth" Journal of Micromechanics and Microengineering 18 035033 (Year: 2008).*

*Primary Examiner* — Mandy C Louie
(74) *Attorney, Agent, or Firm* — XSENSUS LLP

(57) ABSTRACT

A substrate processing method includes step a), step b), step c), step d), step e), and step f). Step a) is a step of providing a substrate that has a pattern where a protection target film is positioned on a bottom part of the pattern. Step b) is a step of laminating a catalyst film on the protection target film. Step c) is a step of forming a protection film that supports the catalyst film from below and covers the protection target film, in the pattern, by a VLS growth method. Step d) is a step of removing the catalyst film. Step e) is a step of applying a predetermined process to a part of the substrate that is different from the pattern in a state where the protection target film is covered by the protection film. Step f) is a step of removing the protection film in the pattern.

12 Claims, 16 Drawing Sheets

(51) Int. Cl.

| | | |
|---|---|---|
| *C23C 16/26* | (2006.01) | |
| *C23C 16/455* | (2006.01) | |
| *C23C 16/50* | (2006.01) | |
| *C23C 16/56* | (2006.01) | |

(52) U.S. Cl.

CPC ........ *C23C 16/26* (2013.01); *C23C 16/45555*
       (2013.01); *C23C 16/50* (2013.01); *C23C 16/56*
                    (2013.01)

(56) References Cited

U.S. PATENT DOCUMENTS

| | | | |
|---|---|---|---|
| 9,754,843 B1 | 9/2017 | Patil et al. | |
| 2011/0227044 A1* | 9/2011 | Kawanaka | H10D 64/647 |
| | | | 977/734 |
| 2012/0153502 A1* | 6/2012 | Price | H01L 21/76877 |
| | | | 257/E21.586 |
| 2019/0148538 A1* | 5/2019 | Ryu | H01L 23/485 |
| | | | 257/773 |

* cited by examiner

SUBSTRATE PROCESSING METHOD

CROSS-REFERENCE TO RELATED APPLICATIONS

This application is a continuation of International Application No. PCT/JP2022/027637, filed on Jul. 14, 2022 which claims the benefit of priority of the prior Japanese Patent Application No. 2021-123465, filed on Jul. 28, 2021, the entire contents of each are incorporated herein by reference.

FIELD

The present disclosure relates to a substrate processing method.

BACKGROUND

There is a technique to form an embedded film in a pattern of a substrate by chemical vapor deposition (Chemical Vapor Deposition: CVD) or atomic layer deposition (Atomic Layer Deposition: ALD).

Patent Literature 1: Japanese Patent Application Publication No. 2020-17708
Patent Literature 2: Japanese Patent Application Publication No. 2014-11165

The present disclosure provides a technique that is capable of reducing a possibility of damage on a protection target film that is positioned on a bottom part of a pattern.

DESCRIPTION OF EMBODIMENTS

Figure 1:
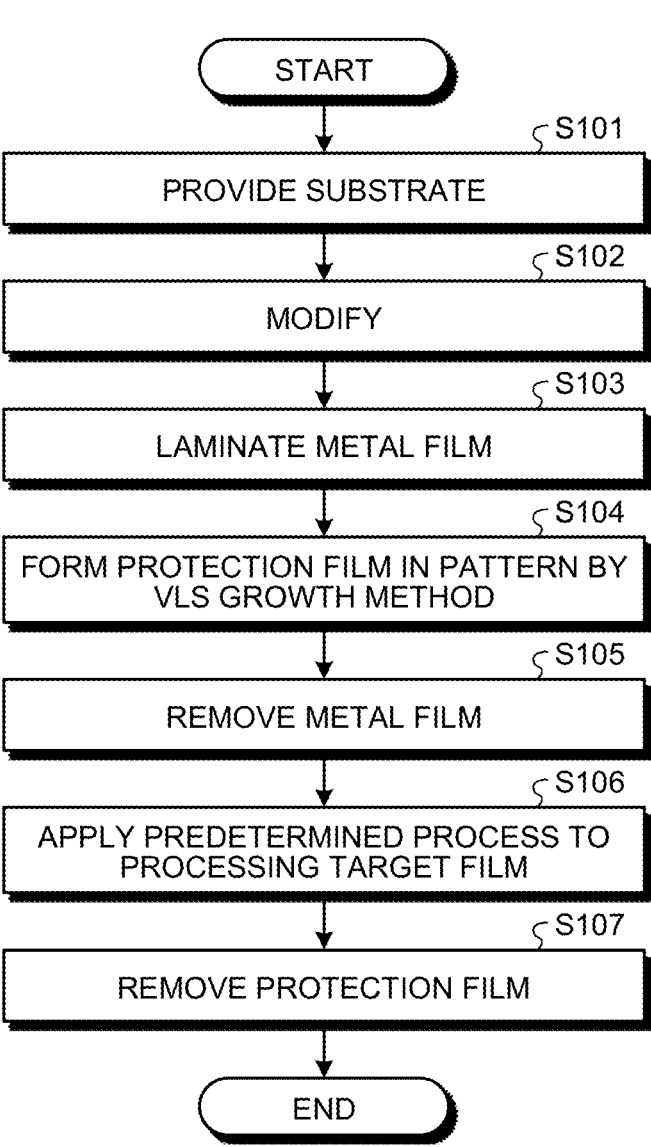
FIG. 1 is a flowchart that illustrates an example of a flow of a substrate processing method according to an embodiment.

Hereinafter, an embodiment(s) of a substrate processing method as disclosed in the present application will be explained in detail with reference to the drawing(s). Additionally, a disclosed substrate processing method is not limited by the present embodiment.

Meanwhile, an embedded film may be utilized as a protection film for protecting a protection target film in a case where such a protection target film is positioned on a bottom part of a pattern of a substrate. For example, after an embedded film that covers a protection target film is formed in a pattern of a substrate by CVD and/or ALD, such a substrate may be exposed to a reactive chemical species so as to apply a predetermined process to a part of such a substrate that is different from such a pattern. For example, film formation, etching, modification that is caused by plasma irradiation, doping with a doping component, etc., are considered as a predetermined process.

However, it is difficult to form an embedded film without generating a space(s) such as a seam and/or a void in a pattern, by CVD and/or ALD. That is, in CVD and/or ALD, film formation starts from a side wall of a pattern and finally opposite films contact one another so as to complete formation of an embedded film, so that a space such as a void or a seam is generated at a part where such films finally contact one another. Hence, when a predetermined process is applied to a part of a substrate that is different from a pattern, a reactive chemical species may pass through a space(s) such as a seam and/or a void on an embedded film so as to reach a protection target film that is positioned on a bottom part of such a pattern. As a result, damage may be caused on a protection target film.

Hence, a technique to reduce a possibility of damage on a protection target film that is positioned on a bottom part of a pattern is expected.

In an under-mentioned explanation, a "pattern" refers to an overall shape that is formed on a substrate. A pattern refers to a whole of a shape that is recessed in a thickness direction of a substrate, for example, a hole, a trench, a line-and-space, etc. Furthermore, a pattern has a "side wall" that is an inner peripheral surface of a recessed shape, a "bottom part" that is a bottom part of such a recessed shape, and a "top part" that is a surface of a substrate near a side wall and is continuous with such a side wall.

Example of Flow of Substrate Processing Method According to Embodiment

FIG. 1 is a flowchart that illustrates an example of a flow of a substrate processing method according to an embodiment. FIG. 2 to FIG. 8 are diagrams that illustrate an example of a flow of a change of a substrate W that is caused by each step of a substrate processing method according to an embodiment.

Figure 2:
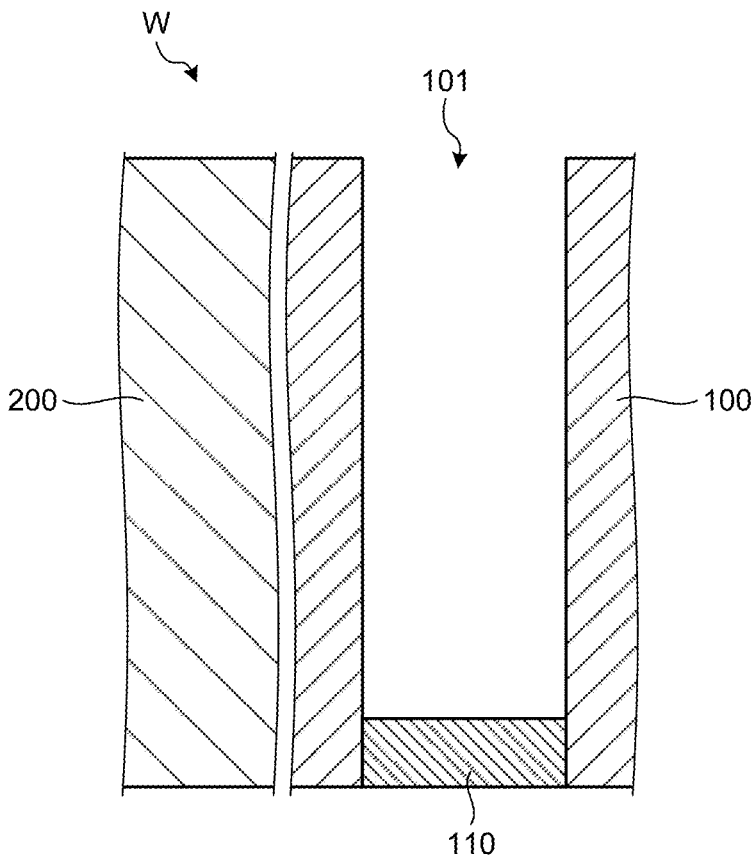
FIG. 2 is a diagram that illustrates an example of a flow of a change of a substrate that is caused by each step of a substrate processing method according to an embodiment.

First, a substrate W as illustrated in FIG. 2 is provided (step S101). FIG. 2 schematically illustrates an example of a cross section of the substrate W in an initial state thereof. The substrate W includes, for example, an insulation film 100 and a processing target film 200, as illustrated in FIG. 2. A pattern 101 is formed on the insulation film 100. A protection target film 110 is positioned on a bottom part of the pattern 101. Furthermore, the processing target film 200 is formed on the substrate W at a position that is different from a position of the pattern 101. The processing target film 200 is an example of a part of the substrate W that is different from the pattern 101.

Figure 3:
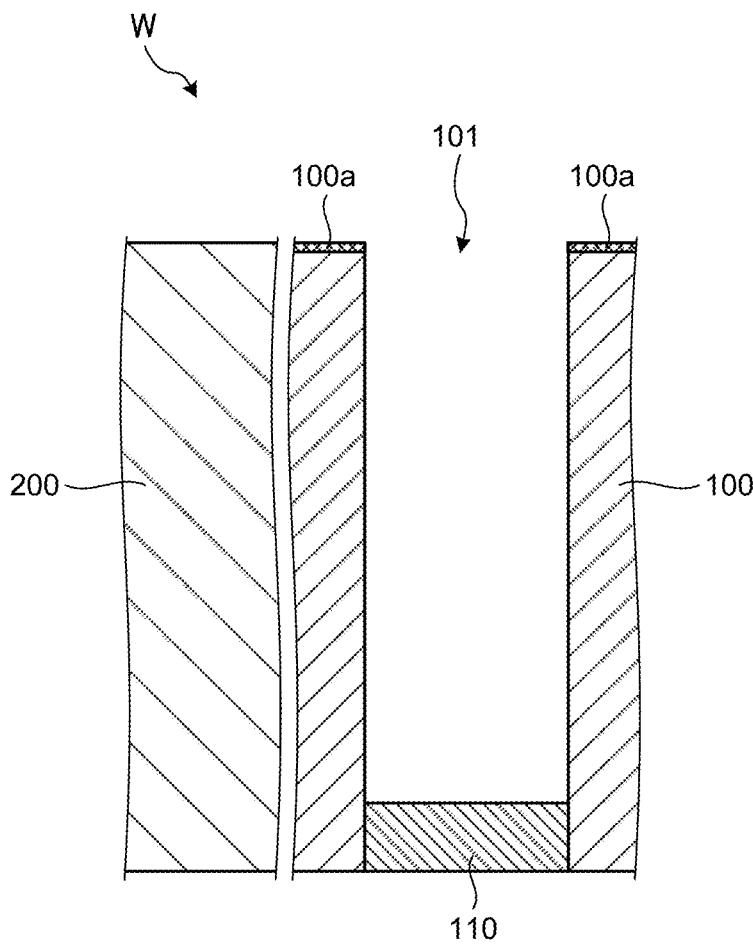
FIG. 3 is a diagram that illustrates an example of a flow of a change of a substrate that is caused by each step of a substrate processing method according to an embodiment.

Then, a surface of a top part of the pattern 101 is modified (step S102). For example, plasma of a reducing gas or an oxidizing gas is produced intermittently and a surface of a top part of the pattern 101 is modified by produced plasma of a reducing gas or an oxidizing gas. Thereby, a lyophobic modification film 100a is formed on a top part of the pattern 101 as illustrated in FIG. 3.

Figure 4:
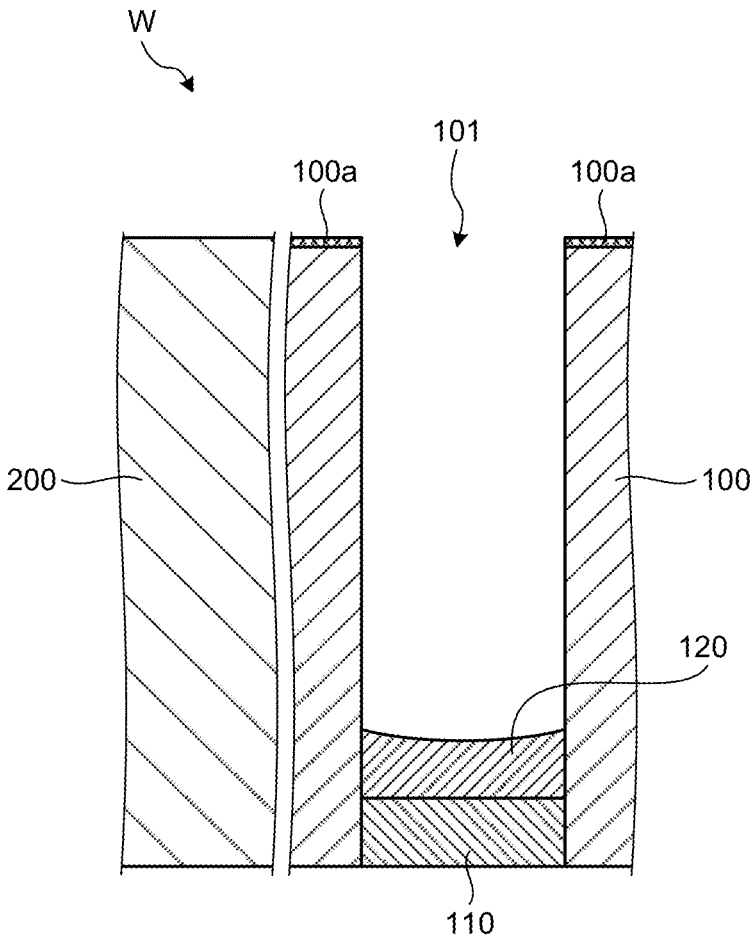
FIG. 4 is a diagram that illustrates an example of a flow of a change of a substrate that is caused by each step of a substrate processing method according to an embodiment.

Then, a colloidal solution that contains a metal (a catalyst) is supplied to a bottom part of the pattern 101, and subsequently, a solvent of such a colloidal solution is vaporized so as to laminate a metal film 120 on the protection target film 110 (step S103, FIG. 4). The lyophobic modification film 100a that inhibits adsorption of a colloidal solution is formed on a top part of the pattern 101, so that such a colloidal solution is not adsorbed on such a top part of the pattern 101 where the modification film 100a is formed. Hence, a colloidal solution is intensively adsorbed on a bottom part of the pattern 101. Thereby, it is possible to laminate the metal film 120 on the protection target film 110 selectively. Additionally, although the metal film 120 is herein laminated by supply of a colloidal solution, the metal film 120 may be laminated by CVD where a liquid that contains a metal is used under a low-temperature environment.

Figure 5:
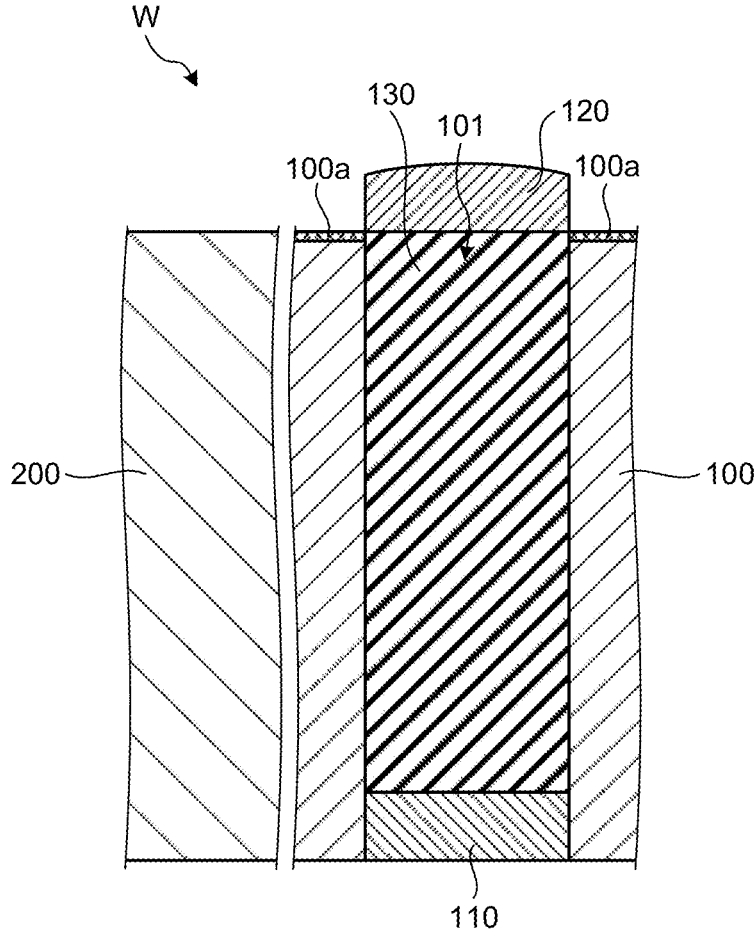
FIG. 5 is a diagram that illustrates an example of a flow of a change of a substrate that is caused by each step of a substrate processing method according to an embodiment.

Then, a protection film 130 that supports the metal film 120 from below and covers the protection target film 110 is formed in the pattern 101 by a VLS (Vapor Liquid Solid) growth method where the metal film 120 is used as a catalyst (step S104, FIG. 5). A VLS growth method is a method that causes eutectic reaction between the metal film 120 that is a catalyst film and a raw material gas so as to grow a film from a bottom part of the pattern 101 in a bottom-up manner. A raw material gas may be supplied together with an inert gas. Furthermore, supply of a raw material gas may be executed under a situation where irradiation with plasma or an ultraviolet ray(s) is executed, from a viewpoint that eutectic reaction between the metal film 120 that is a catalyst film and such a raw material gas is accelerated so as to accelerate growth of the protection film 130.

Figure 6:
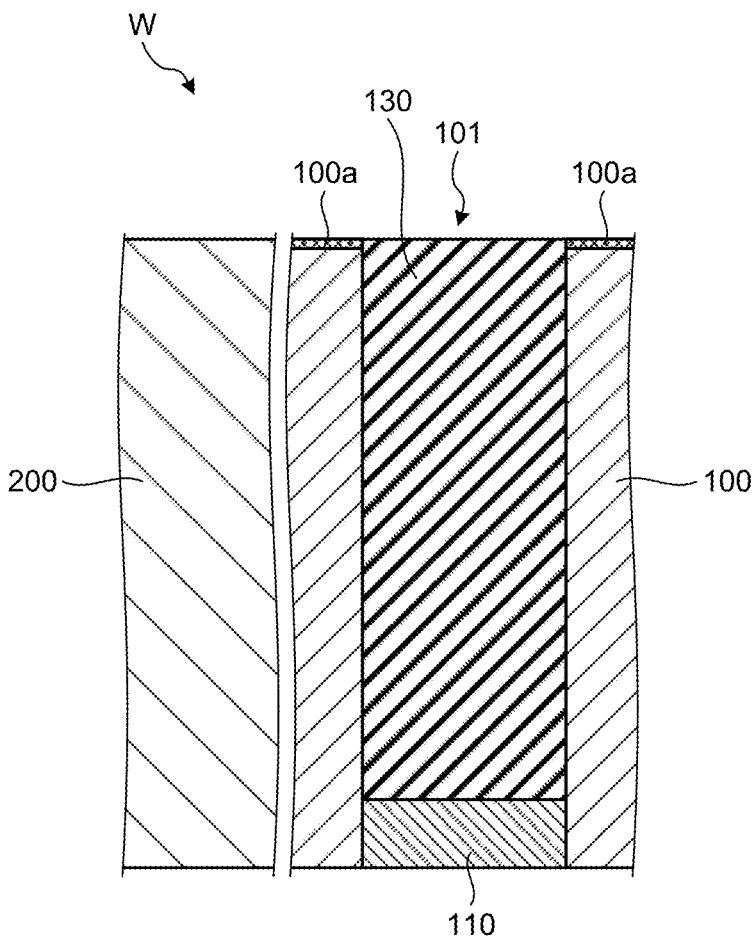
FIG. 6 is a diagram that illustrates an example of a flow of a change of a substrate that is caused by each step of a substrate processing method according to an embodiment.

Then, the metal film 120 that is supported from below by the protection film 130 is removed (step S105, FIG. 6). Removal of the metal film 120 is realized by, for example, dry etching or chemical mechanical polishing (Chemical Mechanical Polishing: CMP).

Figure 7:
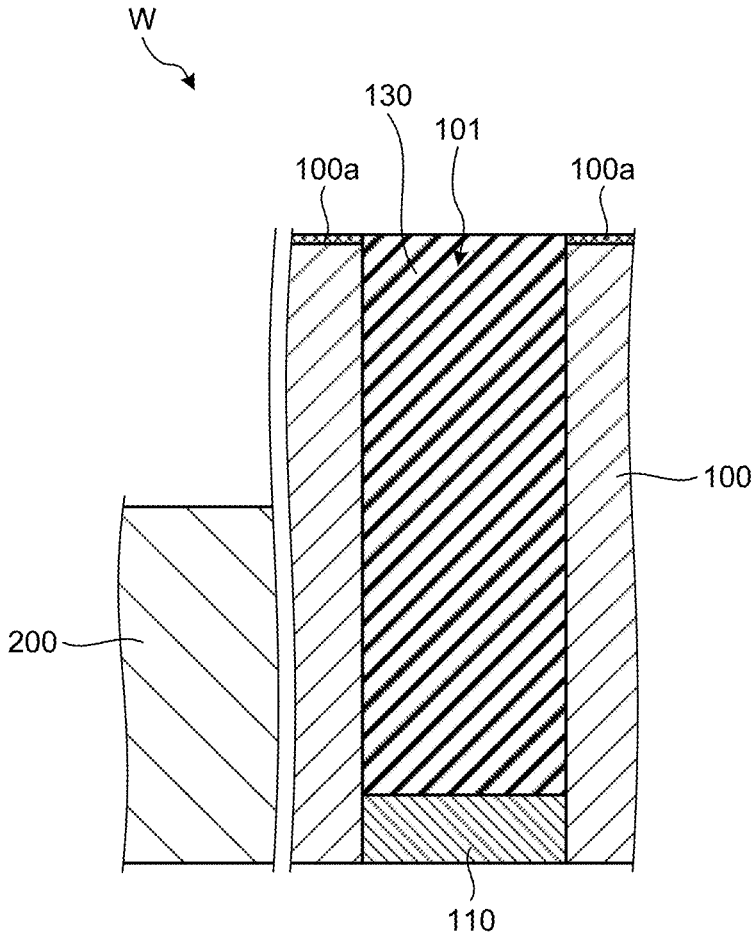
FIG. 7 is a diagram that illustrates an example of a flow of a change of a substrate that is caused by each step of a substrate processing method according to an embodiment.
Figure 8:
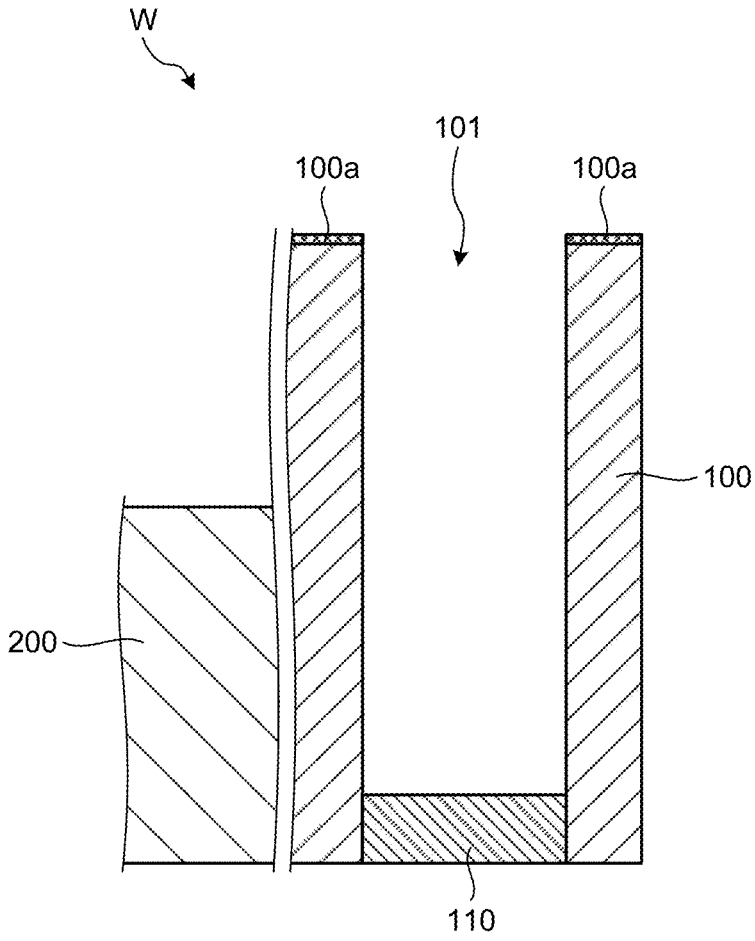
FIG. 8 is a diagram that illustrates an example of a flow of a change of a substrate that is caused by each step of a substrate processing method according to an embodiment.

Then, a predetermined process is applied to the processing target film 200 of the substrate W (step S106). A predetermined process is a process that exposes the processing target film 200 of the substrate W to a reactive chemical species. In the present embodiment, a predetermined process is a process that exposes the processing target film 200 of the substrate W to a reactive chemical species so as to execute etching thereof, by wet etching or dry etching. Thereby, a cross section of the substrate W is, for example, a cross section as illustrated in FIG. 7. Additionally, in another mode, a predetermined process may be a process of film formation, modification that is caused by plasma irradiation, doping with a doping component, etc., for the processing target film 200 of the substrate W.

Then, the protection film 130 in the pattern 101 is removed (step S107, FIG. 8) and such a process is ended. This is an example of a flow of a process of a substrate processing method according to an embodiment.

During a process as illustrated in FIG. 1, an order of a metal film removal step (step S105) and a processing step (step S106) is interchangeable. That is, the metal film 120 may be removed from the protection film 130 after a predetermined process is applied to the processing target film 200 of the substrate W.

Figure 9:
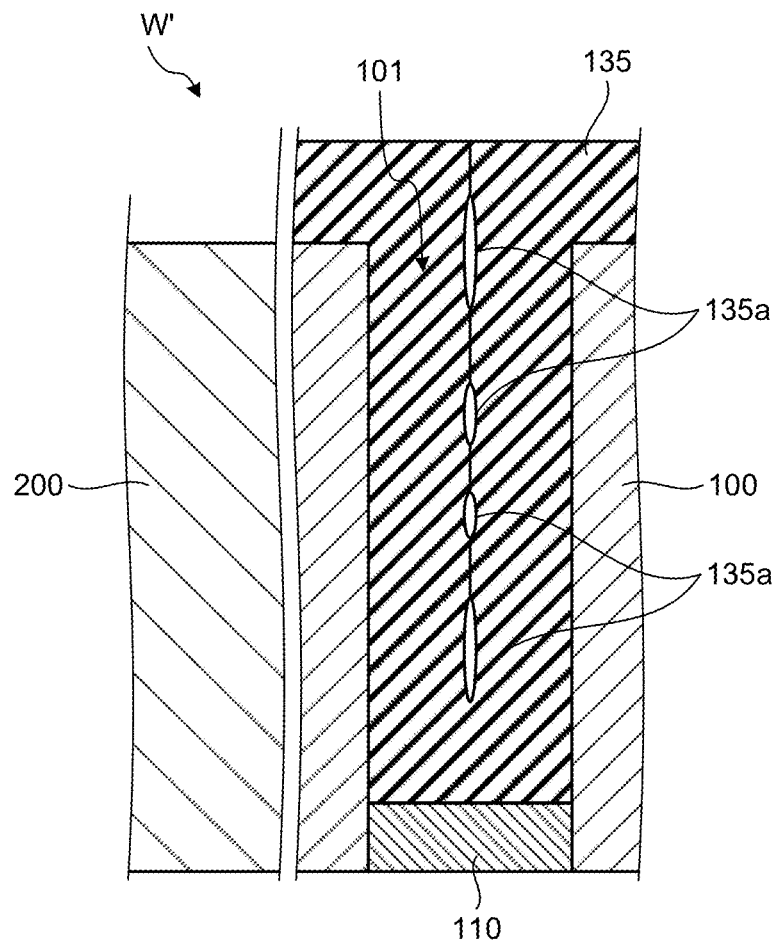
FIG. 9 is a cross-sectional view that illustrates an example of a substrate in a comparative example after an embedded film is formed by CVD and/or ALD.

Meanwhile, it is also considered that an embedded film that covers the protection target film 110 is formed as a protection film in the pattern 101 by CVD and/or ALD instead of a VLS growth method. In such a case, film formation starts from a side wall of the pattern 101 and finally opposite films contact one another so as to complete formation of an embedded film. Thereby, a cross section of a substrate W' is, for example, a cross section as illustrated in FIG. 9. FIG. 9 is a cross-sectional view that illustrates an example of a substrate W' in a comparative example after an embedded film 135 is formed by CVD and/or ALD. In the embedded film 135 that is formed by CVD and/or ALD, a space 135a such as a void or a seam is generated at a part where films finally contact one another.

As the space 135a is generated in the embedded film 135, a reactive chemical species at a time when a predetermined process is applied to the processing target film 200 of the substrate W may pass through the space 135a of the embedded film 135, so as to reach the protection target film 110 that is positioned on a bottom part of the pattern 101. As a result, damage may be caused on the protection target film 110.

On the other hand, in a substrate processing method according to the present embodiment, the protection film 130 is formed in the pattern 101 by a VLS growth method in a bottom-up manner and a predetermined process is applied to the processing target film 200 of the substrate W in a state where the protection target film 110 is covered by the protection film 130. The protection film 130 that is formed in a bottom-up manner is a voidless and seamless film. Hence, when a predetermined process is applied to the processing target film 200 of the substrate W, it is possible to prevent a reactive chemical species from reaching the protection target film 110 that is positioned on a bottom part of the pattern 101. As a result, in a substrate processing method according to the present embodiment, it is possible to reduce a possibility of damage on the protection target film 110.

Film Type of Substrate

Additionally, a film type of the protection target film 110 in an embodiment is not particularly limited. The protection target film 110 may be, for example, a metal-containing film or a carbon-containing film, etc.

Furthermore, the metal film 120 that is laminated on the protection target film 110 in an embodiment may include, for example, at least one of gallium and gold.

Furthermore, although the metal film 120 in an embodiment is used as a catalyst in a VLS growth method, a non-metallic catalyst may be used. For a non-metallic catalyst, it is possible to use, for example, carbon.

Furthermore, a film type of the protection film 130 in an embodiment is not particularly limited. The protection film 130 may be, for example, a lamination film that includes at least two films that are selected from a carbon film, a silicon film, a metal film, a silicon oxide film, a silicon nitride film, a silicon carbide film, a metal oxide film, a metal nitride film, a metal carbide film, or a set that is composed of these films, etc.

Furthermore, it is possible to determine a raw material gas that is used at a time when the protection film 130 is formed by a VLS growth method, appropriately, depending on a film type of the protection film 130 to be formed. For example, in a case where a carbon film is formed as the protection film 130, it is possible to use a hydrocarbon-type gas for a raw material gas. Furthermore, for example, in a case where a silicon film is formed as the protection film 130, it is possible to use a silane-type gas.

Furthermore, in a case where an oxide film, a nitride film, or a carbide film is formed as the protection film 130, an oxidizing gas, a nitriding gas, or a carbiding gas may be supplied after a raw material gas is supplied. Furthermore, in a case where a lamination film where a plurality of films are laminated is formed as the protection film 130, different raw material gasses that correspond to such a plurality of films may be supplied sequentially.

Furthermore, a film type of the processing target film 200 in an embodiment is not particularly limited. The processing target film 200 may be, for example, a silicon oxide film (SiO) or a silicon nitride film (SiN), etc.

Type of Chemical Species that is Used for Predetermined Process

Additionally, a type of a reactive chemical species that is used for a predetermined process that is applied to the processing target film 200 of the substrate W in an embodiment is not particularly limited. In a case where a predetermined process is wet etching, it is possible to use, for example, a dilute hydrofluoric acid, a phosphoric acid, or a fluoro-nitric acid, etc., for a reactive chemical species. A reactive chemical species to be used is determined appropriately depending on a combination of a film type of the processing target film 200 and a film type of the protection film 130. For example, in a case where the processing target film 200 is a silicon nitride film and the protection film 130 is a silicon oxide film, a reactive chemical species to be used is a phosphoric acid. Furthermore, for example, in a case where the processing target film 200 is a silicon oxide film and the protection film 130 is a silicon film, a reactive chemical species to be used is a dilute hydrofluoric acid. Furthermore, in a case where a predetermined process is dry etching, it is possible to use, for example, a fluorocarbon gas or a chlorine-containing gas, etc., for a reactive chemical species.

Figure 10:
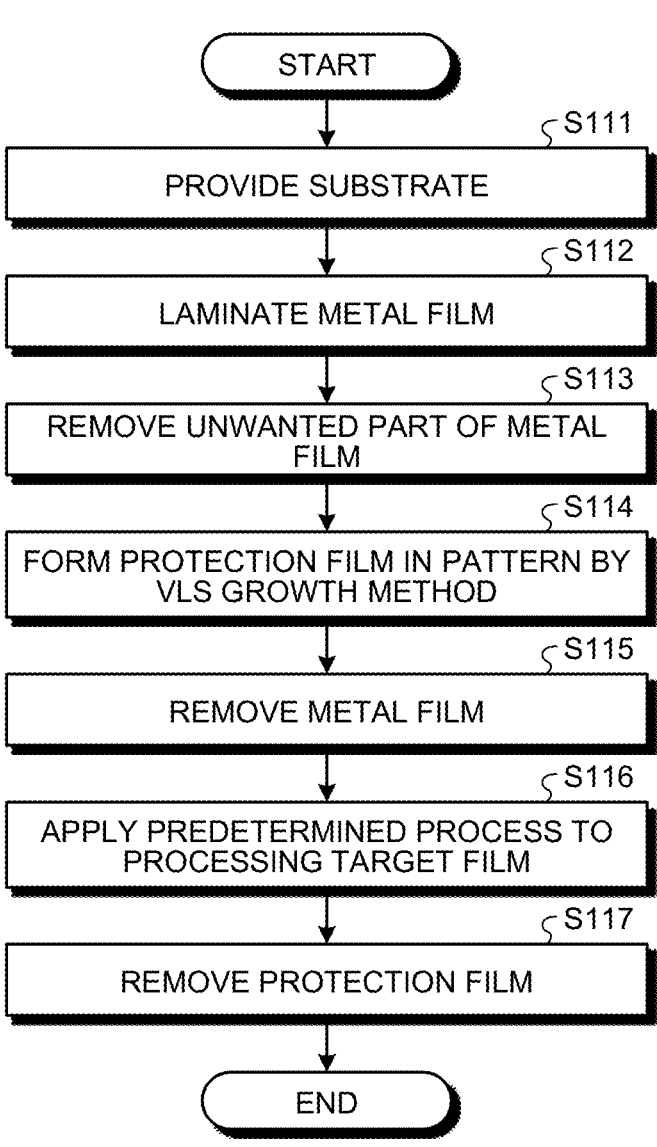
FIG. 10 is a flowchart that illustrates an example of a flow of a substrate processing method according to a variation of an embodiment.

Example of Flow of Substrate Processing Method According to Variation of Embodiment FIG. 10 is a flowchart that illustrates an example of a flow of a substrate processing method according to a variation of an embodiment. FIG. 11 to FIG. 16 are diagrams that illustrate an example of a flow of a change of a substrate W that is caused by each step of a substrate processing method according to a variation of an embodiment. Such a variation relates to a variation of a step of laminating a metal film on a protection target film 110 in an embodiment (steps S102 and S103).

First, a substrate W is provided (step S111). The substrate W in an initial state thereof in a variation is similar to a substrate W as illustrated in FIG. 2.

Figure 11:
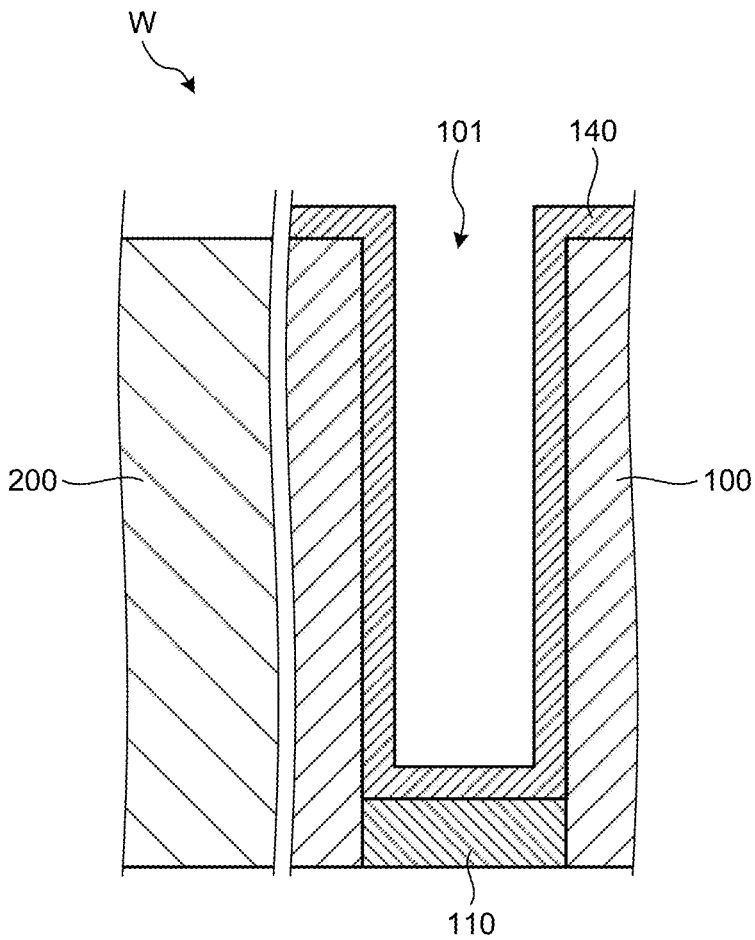
FIG. 11 is a diagram that illustrates an example of a flow of a change of a substrate that is caused by each step of a substrate processing method according to a variation of an embodiment.

Then, a metal film 140 is laminated on a top part and a side wall of a pattern 101 and on a protection target film 110 by ALD (step S112, FIG. 11). Additionally, the metal film 140 may be laminated by CVD instead of ALD.

Figure 12:
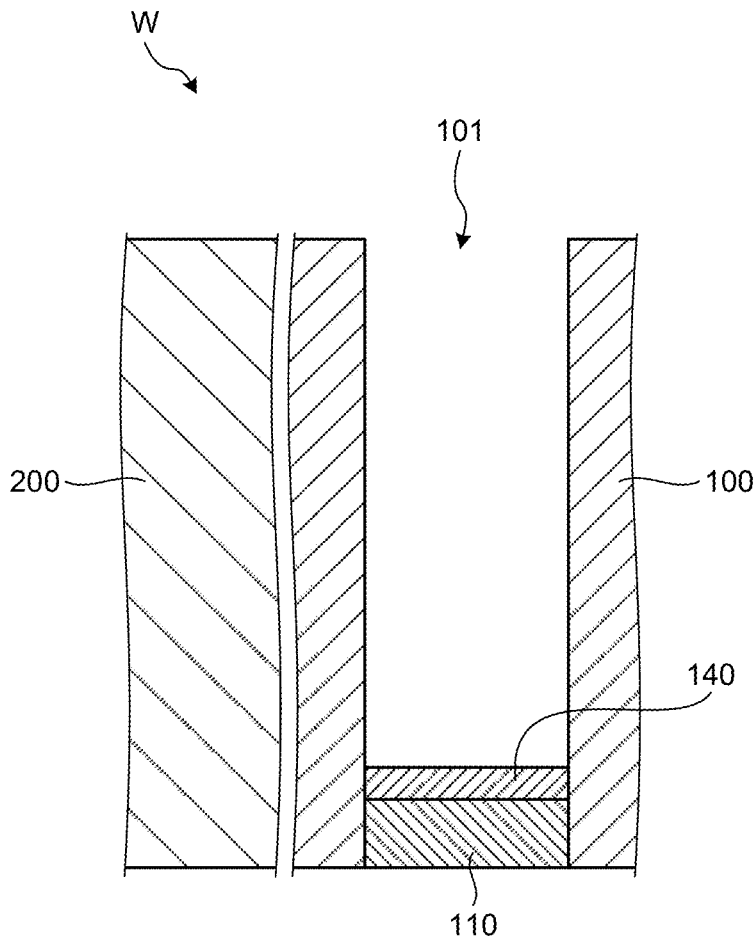
FIG. 12 is a diagram that illustrates an example of a flow of a change of a substrate that is caused by each step of a substrate processing method according to a variation of an embodiment.

Then, a part of the metal film 140 that is laminated on a top part and a side wall of the pattern 101 is removed so as to leave the metal film 140 on the protection target film 110 (step S113, FIG. 12). Specifically, an unwanted part is selectively removed by isotropic dry etching. Thereby, it is possible to laminate the metal film 140 on the protection target film 110 selectively. Additionally, CMP or atomic layer etching (Atomic Layer Etching: ALE) may be applied to a top part of the pattern 101 as needed.

Figure 13:
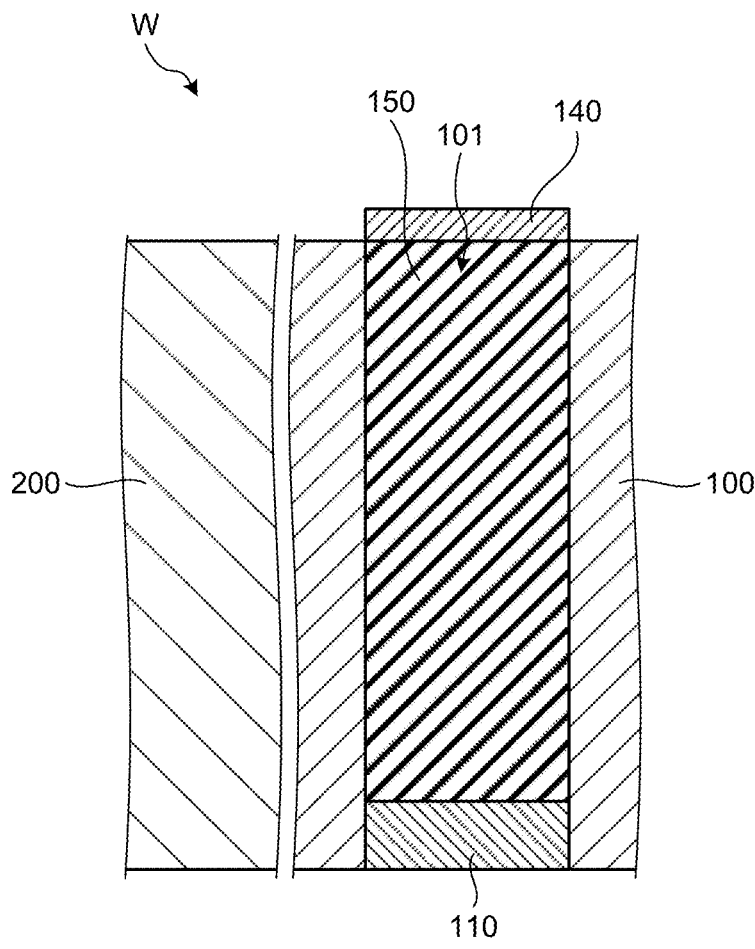
FIG. 13 is a diagram that illustrates an example of a flow of a change of a substrate that is caused by each step of a substrate processing method according to a variation of an embodiment.

Then, a protection film 150 that supports the metal film 140 from below and covers the protection target film 110 is formed in the pattern 101 by a VLS growth method where the metal film 140 is used as a catalyst (step S114, FIG. 13). A VLS growth method is a method that causes eutectic reaction between the metal film 140 that is a catalyst film and a raw material gas so as to grow a film from a bottom part of the pattern 101 in a bottom-up manner. A raw material gas may be supplied together with an inert gas. Furthermore, supply of a raw material gas may be executed under a situation where irradiation with plasma or an ultraviolet ray(s) is executed, from a viewpoint that eutectic reaction between the metal film 140 that is a catalyst film and a raw material gas is accelerated so as to accelerate growth of the protection film 150.

Figure 14:
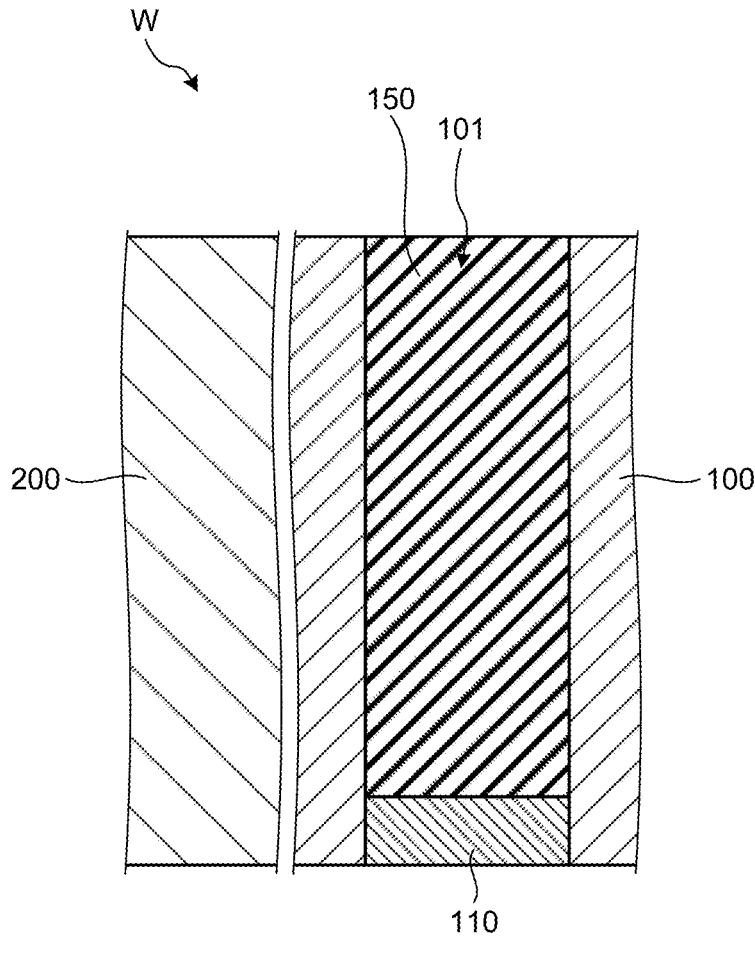
FIG. 14 is a diagram that illustrates an example of a flow of a change of a substrate that is caused by each step of a substrate processing method according to a variation of an embodiment.

Then, the metal film 140 is removed from the protection film 150 that is formed in the pattern 101 (step S115, FIG. 14). Removal of the metal film 140 is realized by, for example, dry etching or CMP.

Figure 15:
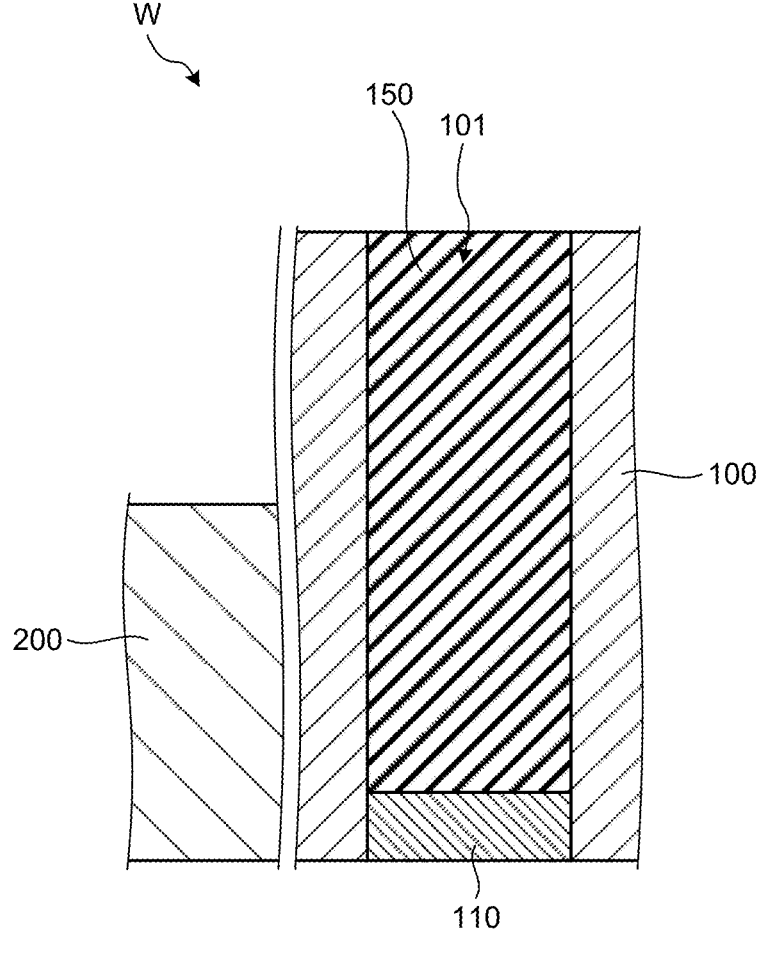
FIG. 15 is a diagram that illustrates an example of a flow of a change of a substrate that is caused by each step of a substrate processing method according to a variation of an embodiment.
Figure 16:
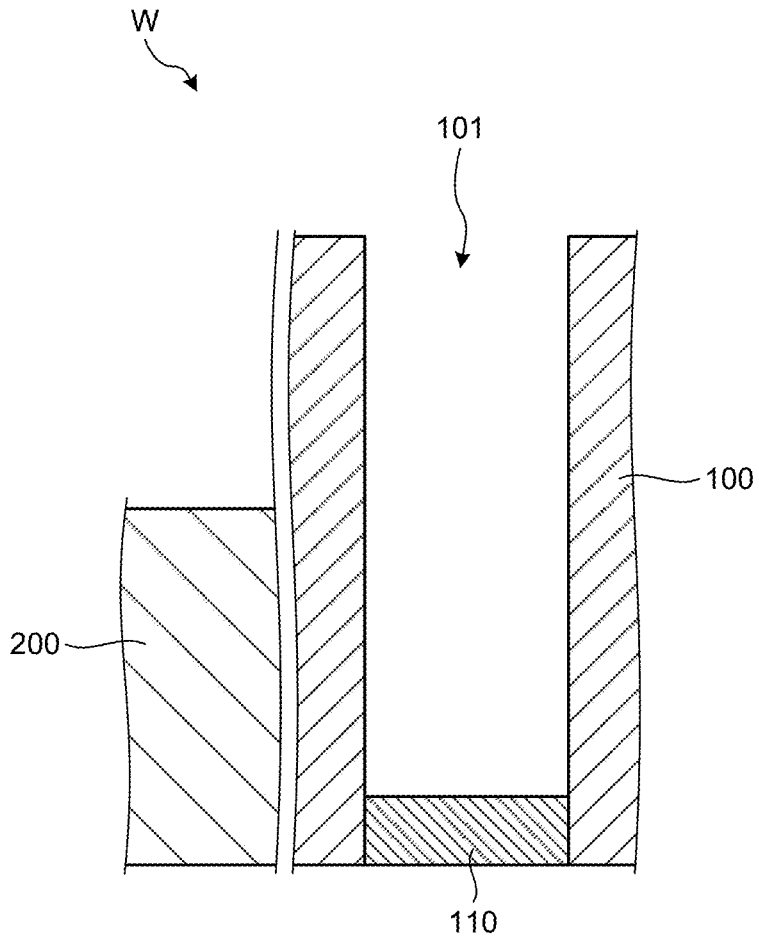
FIG. 16 is a diagram that illustrates an example of a flow of a change of a substrate that is caused by each step of a substrate processing method according to a variation of an embodiment.

Then, a predetermined process is applied to a processing target film 200 of the substrate W (step S116). In a variation of the present embodiment, a predetermined process is a process that exposes the processing target film 200 of the substrate W to a reactive chemical species so as to execute etching thereof, by wet etching or dry etching. Thereby, a cross section of the substrate W is, for example, a cross section as illustrated in FIG. 15. Additionally, in another mode, a predetermined process may be a process of film formation, modification that is caused by plasma irradiation, doping with a doping component, etc., for the processing target film 200 of the substrate W.

Then, the protection film 150 in the pattern 101 is removed (step S117, FIG. 16) and such a process is ended. This is an example of a flow of a process of a substrate processing method according to a variation of an embodiment.

Another Variation

In an embodiment as described above, a step of forming the protection film 130, 150 (step S104, S114) may form the protection film 130, 150 with a film thickness that does not completely embed the pattern 101, in the pattern 101, by a VLS growth method.

Effect of Embodiment

A substrate processing method according to an embodiment as described above includes step a), step b), step c), step d), step e), and step f). Step a) is a step of providing a substrate (for example, a substrate W) that has a pattern (for example, a pattern 101) where a protection target film (for example, a protection target film 110) is positioned on a bottom part of the pattern. Step b) is a step of laminating a catalyst film (for example, a metal film 120, 140) on the protection target film that is positioned on the bottom part of the pattern. Step c) is a step of forming a protection film (for example, a protection film 130, 150) that supports the catalyst film from below and covers the protection target film, in the pattern, by a VLS growth method. Step d) is a step of removing the catalyst film that is supported from below by the protection film. Step e) is a step of applying a predetermined process to a part of the substrate (for example, a processing target film 200) that is different from the pattern in a state where the protection target film is covered by the protection film. Step f) is a step of removing the protection film in the pattern. Thereby, according to an embodiment, it is possible to reduce a possibility of damage on a protection target film that is positioned on a bottom part of a pattern.

Furthermore, an order of step d) as described above and step e) as described above is interchangeable. Thereby, according to an embodiment, it is possible to reduce a possibility of damage on a protection target film that is positioned on a bottom part of a pattern.

Furthermore, step b) as described above may include step b-1) and step b-2). Step b-1) is a step of modifying a surface of a top part of the pattern so as to form a lyophobic modification film (for example, a modification film 100*a*) on the top part of the pattern. Step b-2) is a step of supplying a colloidal solution that contains a catalyst to the bottom part of the pattern in a state where the modification film is formed on the top part of the pattern, and subsequently, vaporizing a solvent of the colloidal solution so as to laminate the catalyst film on the protection target film. Furthermore, step b-1) as described above may modify a surface of the top part of the pattern by plasma of a reducing gas or an oxidizing gas. Thereby, according to an embodiment, it is possible to laminate a catalyst film on a protection target film selectively.

Furthermore, step b) as described above may include step b-3) and step b-4). Step b-3) is a step of laminating the catalyst film on the top part and a side wall of the pattern and on the protection target film by CVD or ALD. Step b-4) is a step of removing a part of the catalyst film that is laminated on the top part and the side wall of the pattern so as to leave the catalyst film on the protection target film. Furthermore, step b-4) as described above may selectively remove the part of the catalyst film by isotropic dry etching. Thereby, according to an embodiment, it is possible to laminate a catalyst film on a protection target film selectively.

Furthermore, c) as described above may form the protection film with a film thickness that does not completely embed the pattern, in the pattern, by a VLS growth method. Thereby, according to an embodiment, it is possible to reduce a possibility of damage on a protection target film and control an amount of a used raw material gas for a protection film.

Furthermore, the protection target film as described above may be a metal-containing film or a carbon-containing film. Thereby, according to an embodiment, it is possible to reduce a possibility of damage on a metal-containing film or a carbon-containing film that is positioned on a bottom part of a pattern.

Furthermore, the catalyst film that is laminated on the protection target film as described above may be a metal film. Furthermore, such a metal film may include at least one of gallium and gold. Thereby, according to an embodiment, it is possible to form a protection film appropriately by a VLS growth method where a metal film is used as a catalyst.

Furthermore, the protection film as described above may be a lamination film that includes at least two films that are selected from a carbon film, a silicon film, a metal film, a silicon oxide film, a silicon nitride film, a silicon carbide film, a metal oxide film, a metal nitride film, a metal carbide film, or a set that is composed of these films. Thereby, according to an embodiment, it is possible to reduce a possibility of damage on a protection target film that is positioned on a bottom part of a pattern.

According to the present disclosure, it is possible to reduce a possibility of damage on a protection target film that is positioned on a bottom part of a pattern.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

Additionally, under-mentioned appendices that are associated with an above-mentioned embodiment(s) are further disclosed.

APPENDIX 1

A substrate processing method, including:

a) a step of providing a substrate that has a pattern where a protection target film is positioned on a bottom part of the pattern;

b) a step of laminating a catalyst film on the protection target film that is positioned on the bottom part of the pattern;

c) a step of forming a protection film that supports the catalyst film from below and covers the protection target film, in the pattern, by a VLS (Vapor Liquid Solid) growth method;

d) a step of removing the catalyst film that is supported from below by the protection film;

e) a step of applying a predetermined process to a part of the substrate that is different from the pattern in a state where the protection target film is covered by the protection film; and f) a step of removing the protection film in the pattern.

APPENDIX 2

A substrate processing method, including:

a) a step of providing a substrate that has a pattern where a protection target film is positioned on a bottom part of the pattern;

b) a step of laminating a catalyst film on the protection target film that is positioned on the bottom part of the pattern;

c) a step of forming a protection film that supports the catalyst film from below and covers the protection target film, in the pattern, by a VLS growth method;

d) a step of applying a predetermined process to a part of the substrate that is different from the pattern in a state where the protection target film is covered by the protection film;

e) a step of removing the catalyst film that is supported from below by the protection film; and f) a step of removing the protection film in the pattern.

APPENDIX 3

The substrate processing method according to appendix 1 or 2, wherein
the b) selectively laminates the catalyst film on the protection target film that is positioned on the bottom part of the pattern.

APPENDIX 4

The substrate processing method according to any one of appendices 1 to 3, wherein
the b) includes:
b-1) a step of modifying a surface of a top part of the pattern so as to form a lyophobic modification film on the top part of the pattern; and
b-2) a step of supplying a colloidal solution that contains a catalyst to the bottom part of the pattern in a state where the modification film is formed on the top part of the pattern, and subsequently, vaporizing a solvent of the colloidal solution so as to laminate the catalyst film on the protection target film.

APPENDIX 5

The substrate processing method according to appendix 4, wherein
The b-1) modifies a surface of the top part of the pattern by plasma of a reducing gas or an oxidizing gas.

APPENDIX 6

The substrate processing method according to any one of appendices 1 to 3, wherein
the b) includes:
b-3) a step of laminating the catalyst film on the top part and a side wall of the pattern and on the protection target film by chemical vapor deposition (Chemical Vapor Deposition: CVD) or atomic layer deposition (Atomic Layer Deposition: ALD); and
b-4) a step of removing a part of the catalyst film that is laminated on the top part and the side wall of the pattern so as to leave the catalyst film on the protection target film.

APPENDIX 7

The substrate processing method according to appendix 6, wherein
the b-4) selectively removes the part of the catalyst film by isotropic dry etching.

APPENDIX 8

The substrate processing method according to any one of appendices 1 to 7, wherein
the c) forms the protection film with a film thickness that does not completely embed the pattern, in the pattern, by a VLS growth method.

APPENDIX 9

The substrate processing method according to any one of appendices 1 to 8, wherein
the protection target film is a metal-containing film or a carbon-containing film.

APPENDIX 10

The substrate processing method according to any one of appendices 1 to 9, wherein
the catalyst film is a metal film.

APPENDIX 11

The substrate processing method according to appendix 10, wherein
the metal film includes at least one of gallium and gold.

APPENDIX 12

The substrate processing method according to any one of appendices 1 to 11, wherein
the protection film is a lamination film that includes at least two films that are selected from a carbon film, a silicon film, a metal film, a silicon oxide film, a silicon nitride film, a silicon carbide film, a metal oxide film, a metal nitride film, a metal carbide film, or a set that is composed of these films.

What is claimed is:

1. A substrate processing method, including:
a) a step of providing a substrate that has a pattern where a protection target film is positioned on a bottom part of the pattern;
b) a step of laminating a catalyst film on the protection target film that is positioned on the bottom part of the pattern;
c) a step of forming a protection film that supports the catalyst film from below and covers the protection target film, in the pattern, by a VLS (Vapor Liquid Solid) growth method;
d) a step of removing the catalyst film that is supported from below by the protection film;
e) a step of applying a predetermined process to a part of the substrate that is different from the pattern in a state where the protection target film is covered by the protection film; and
f) a step of removing the protection film in the pattern, wherein
the c) forms the protection film, in the pattern, in a bottom-up manner from the bottom part of the pattern by the VLS growth method.

2. A substrate processing method, including:
a) a step of providing a substrate that has a pattern where a protection target film is positioned on a bottom part of the pattern;
b) a step of laminating a catalyst film on the protection target film that is positioned on the bottom part of the pattern;
c) a step of forming a protection film that supports the catalyst film from below and covers the protection target film, in the pattern, by a VLS growth method;
d) a step of applying a predetermined process to a part of the substrate that is different from the pattern in a state where the protection target film is covered by the protection film;
e) a step of removing the catalyst film that is supported from below by the protection film; and
f) a step of removing the protection film in the pattern, wherein
the c) forms the protection film, in the pattern, in a bottom-up manner from the bottom part of the pattern by the VLS growth method.

3. The substrate processing method according to claim 1, wherein the b) selectively laminates the catalyst film on the protection target film that is positioned on the bottom part of the pattern.

4. The substrate processing method according to claim 1, wherein the b) includes:

b-1) a step of modifying a surface of a top part of the pattern to form a lyophobic modification film on the top part of the pattern; and b-2) a step of supplying a colloidal solution that contains a catalyst to the bottom part of the pattern in a state where the modification film is formed on the top part of the pattern, and subsequently, vaporizing a solvent of the colloidal solution to laminate the catalyst film on the protection target film.

5. The substrate processing method according to claim 4, wherein

The b-1) modifies a surface of the top part of the pattern by plasma of a reducing gas or an oxidizing gas.

6. The substrate processing method according to claim 1, wherein the b) includes:

b-3) a step of laminating the catalyst film on the top part and a side wall of the pattern and on the protection target film by chemical vapor deposition (Chemical Vapor Deposition: CVD) or atomic layer deposition (Atomic Layer Deposition: ALD); and b-4) a step of removing a part of the catalyst film that is laminated on the top part and the side wall of the pattern to leave the catalyst film on the protection target film.

7. The substrate processing method according to claim 6, wherein the b-4) selectively removes the part of the catalyst film by isotropic dry etching.

8. The substrate processing method according to claim 1, wherein the c) forms the protection film with a film thickness that does not completely embed the pattern, in the pattern, by the VLS growth method.

9. The substrate processing method according to claim 1, wherein the protection target film is a metal-containing film or a carbon-containing film.

10. The substrate processing method according to claim 1, wherein the catalyst film is a metal film.

11. The substrate processing method according to claim 10, wherein the metal film includes at least one of gallium and gold.

12. The substrate processing method according to claim 1, wherein the protection film is a lamination film that includes at least two films that are selected from a carbon film, a silicon film, a metal film, a silicon oxide film, a silicon nitride film, a silicon carbide film, a metal oxide film, a metal nitride film, a metal carbide film, or a set that is composed of these films.

* * * * *